United States Patent [19]
Abel et al.

[11] Patent Number: 5,136,779
[45] Date of Patent: Aug. 11, 1992

[54] METHOD OF MOUNTING LEAD FRAME ON SUBSTRATE

[75] Inventors: Baron E. Abel, Wrightsville; David L. Archer, Harrisburg, both of Pa.

[73] Assignee: Die Tech, Inc., York Haven, Pa.

[21] Appl. No.: 752,199

[22] Filed: Aug. 20, 1991

Related U.S. Application Data

[60] Division of Ser. No. 599,262, Oct. 19, 1990, Pat. No. 5,057,901, which is a continuation of Ser. No. 413,192, Sep. 27, 1989, abandoned.

[51] Int. Cl.⁵ .................................................. H01R 43/02
[52] U.S. Cl. .................................................. 29/827; 29/840
[58] Field of Search .......................... 29/827, 832, 840; 357/69, 70

[56] References Cited

U.S. PATENT DOCUMENTS

| | | | |
|---|---|---|---|
| 4,120,558 | 10/1978 | Seidler | 339/275 |
| 4,214,120 | 7/1980 | Jones, Jr. et al. | 174/52 |
| 4,257,668 | 3/1981 | Ellis, Jr. | 339/258 |
| 4,357,069 | 11/1982 | Milora | 339/275 |
| 4,367,910 | 1/1983 | Seidler | 339/275 |
| 4,592,617 | 6/1986 | Seidler | 339/275 |
| 4,766,478 | 8/1988 | Dennis | 357/70 |
| 4,782,589 | 11/1988 | Dennis | 29/827 |
| 4,816,427 | 3/1989 | Dennis | 437/209 |

Primary Examiner—Timothy V. Eley
Attorney, Agent, or Firm—Thomas Hooker

[57] ABSTRACT

A lead frame for orienting and then mounting a plurality of clip leads on a semi-conductor device or substrate and method.

9 Claims, 2 Drawing Sheets

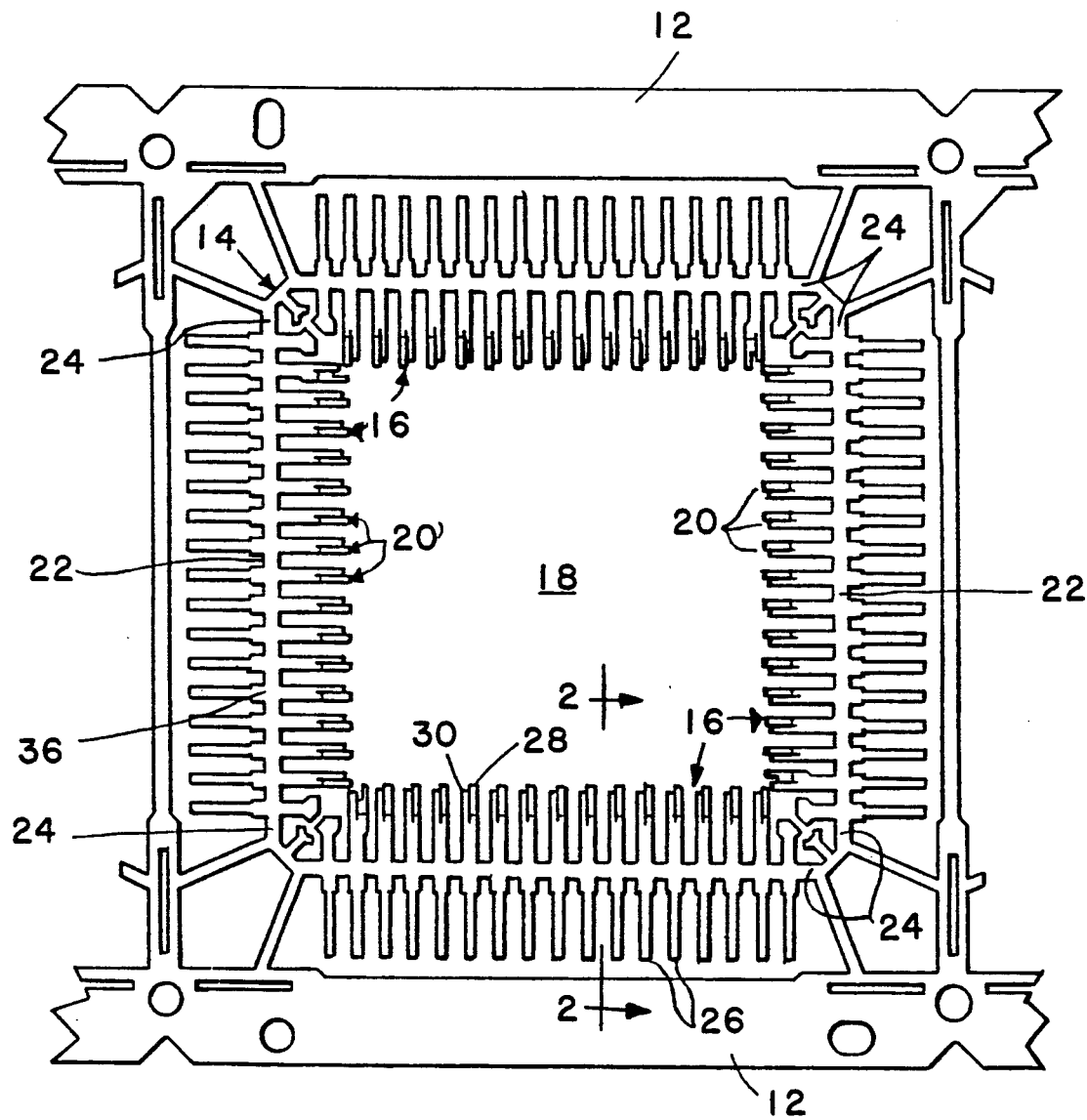
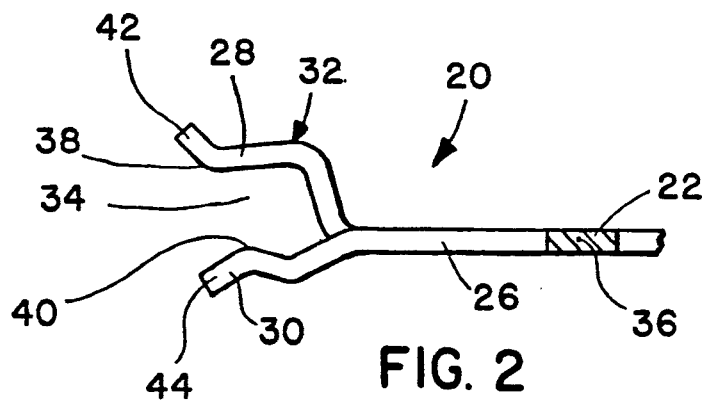
FIG. 1
FIG. 2

METHOD OF MOUNTING LEAD FRAME ON SUBSTRATE

This is a divisional of co-pending application Ser. No. 599,262, filed Oct. 19, 1990, which issued Oct. 15, 1991, as U.S. Pat. No. 5,057,901, which was a continuation of Ser. No. 413,192, filed Sep. 27, 1989, now abandoned.

FIELD OF THE INVENTION

The invention relates to stamped metal lead frames for receiving and forming electrical connections with semi-conductor devices, typically of the substrate type and to methods for mounting substrates on the individual leads in a lead frame.

DESCRIPTION OF THE PRIOR ART

U.S. Pat. Nos. 4,766,478, 4,782,589 and 4,816,427 disclose lead frames with rows of pivot-mounted leads extending in rows along the sides of a central opening. The leads are pivoted above the plane of the frame and a substrate is freely positioned between open diverging arms located on the ends of the leads. The leads are then pivoted back to the plane of the lead frame to lower the substrate and capture the edges of the substrate within the open arms on the ends of the leads. Subsequently, the upper and lower arms are bent together onto the substrate and soldered to pads on the substrate.

U.S. Pat. Nos. 4,766,478, 4,782,589 and 4,816,427 are assigned to Die Tech, Inc., 295 Sipe Road, York Haven, Pa. 17370, assignee of the present invention.

SUMMARY OF THE INVENTION

The disclosed lead frames includes rows of like leads each extending along one side of the central substrate opening. Each lead includes a resilient two arm clip facing the opening. A semiconductor device or substrate is mounted on the leads by first pivoting the leads upwardly so that lead in ends of the lower arms of each clip extend into the opening and form a substrate support extending around the circumference of the opening for holding the substrate in aligned position with respect to the clips. The substrate is lowered and the leads are pivoted back to the plane of the lead frame. Initial contact between the upper clip arms and upper corners at the substrate occurs inwardly of contact surfaces on the upper arms. The contacts on the lower arms are moved smoothly onto the substrate. Further lowering of the substrate wipes the contact on both arms along the top and bottom surfaces of the substrate without injury to the contacts or the substrate.

The thickness of the substrate is greater than the minimum width of the clips so that insertion of the substrate into the frame positions the arms on both sides of the substrate and at the same time spreads the arms apart a distance to provide desired contact pressure between the contacts and pads on the substrate. Following insertion, permanent electrical connections, such as solder connections, welded connections and the like, may be formed between the arms and substrate.

Other objects and features of the invention will become apparent as the description proceeds, especially when taken in conjunction with the accompanying drawings illustrating the invention, of which there are 2 sheets and one embodiment.

DESCRIPTION OF THE DRAWINGS

FIG. 1 is a plan view of a continuous stamped, formed lead frame according to the invention;

FIG. 2 is an enlarged sectional view showing one lead taken along line 2—2 of FIG. 1.

DESCRIPTION OF THE PREFERRED EMBODIMENT

Figure 3:
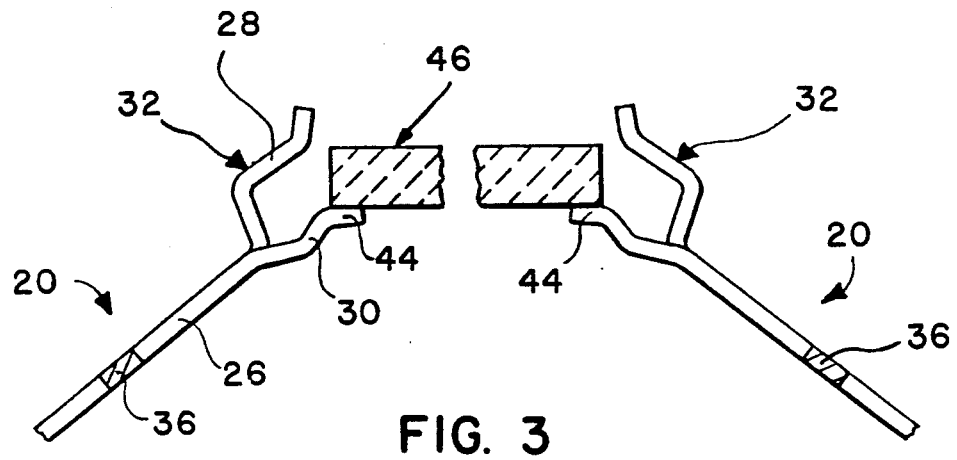
FIGS. 3, 4 and 5 are views showing leads on both sides of the frame during mounting of a substrate in the frame.

A lead frame as shown in FIG. 1 is stamp formed from a uniform thickness metal strip stock and includes a pair of continuous carrier strips 12 on the opposite sides of the lead frame. The strips support a plurality of like frames 14 spaced at regular intervals along the length of the lead frame. Each frame includes four rows 16 of multiple leads defining a central square opening 18. Individual leads 20 in each row facing the opening are supported on continuous mounting strips 22 extending along the sides of the opening. The ends of the mounting strips are connected to the lead frame by hinges 24.

As shown in FIG. 2, each lead 20 includes an elongate tail 26 extending away from opening 18 and across strip 22 and a pair of contact arms 28 and 30 forming a clip 32 on the end of the lead facing the opening 18. The arms on either side of open clip mouth 34 are formed by splitting the inner ends of tails 26. The lead frame is manufactured with the lead tails 26 in the plane of the lead frame.

As shown in FIG. 2, clip arm 28 includes a contact 38 facing mouth 34 and arm 30 includes a contact 40 also facing mouth 34. Contact 38 is located further away from the bottom of the clip and nearer the opening 18 than contact 40. The free ends on arms 28 and 30 include lead ins 42 and 44 respectively which extend to either side of the clip and enlarge the open end of mouth 34.

Figure 4:
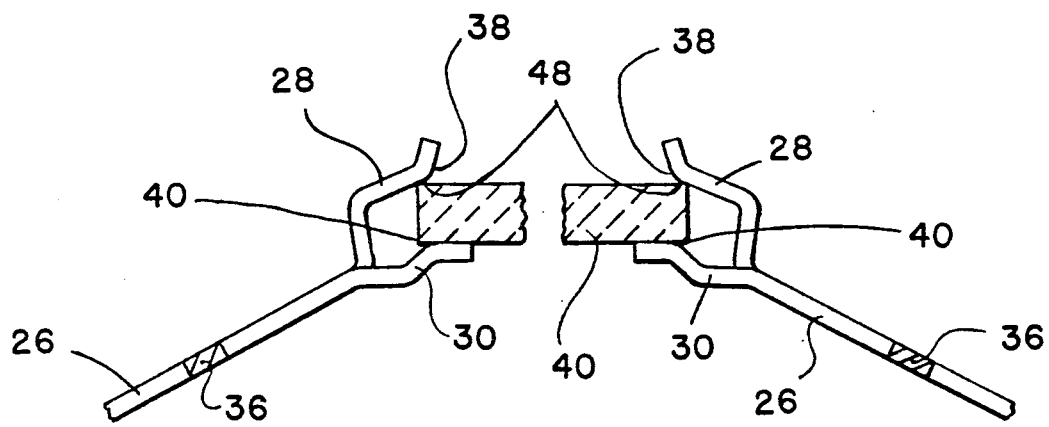
Figure 5:
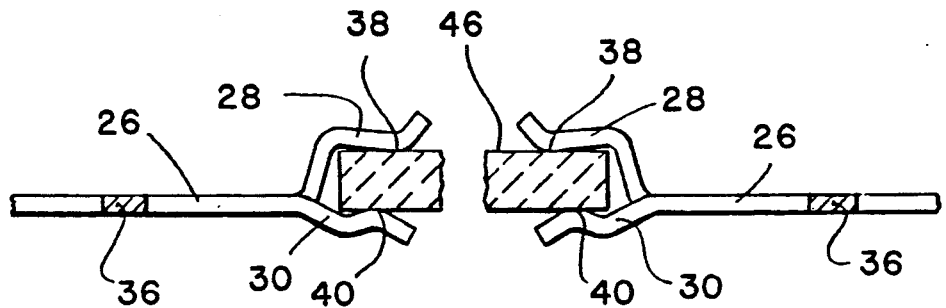

FIGS. 3, 4 and 5 illustrate mounting of a square substrate 46 in frame 14 of lead frame. Prior to engagement between the substrate and the individual leads 20 each row of leads is rotated upwardly about axis 36 so that all of the clips 32 face upwardly as shown in FIG. 3 and the lead ins 44 on the ends of lower arms 30 lie essentially in a horizontal plane and define a flat support surface parallel to the lead frame for receiving and initially supporting substrate 46. With the leads bent up as shown, lead ins 44 are located inwardly of the upper arm 28 and permit vertical movement of the substrate down past arms 28 and onto the lead ins 44. The clips extend circumferentially around the opening 18 and confine substrate 46 in a known location within the opening so that contact pads on the substrate (not illustrated) are in proper position for forming electrical connections with leads 20 after the substrate has been lowered into contact position has shown in FIG. 5.

The leads may be rotated to the position of FIG. 3 as desired. For instance, the insertion tooling may include a bar extending along the free ends of lead tails 26 so that lowering of the bars pivots the leads upwardly. Likewise, a bar may be brought into engagement with the underside of the end of the tails adjacent the clips to force the clips upwardly. The tails may be clamped against either bar to assure they are properly positioned for receiving the substrate.

With the substrate in place as shown in FIG. 3, insertion is completed by lowering the substrate and at the same time pivoting the leads 20 back down around axis 36 to the plane of frame 14. FIG. 4 illustrates a position at which the substrate has been lowered sufficiently to move the upper clip arms 28 into contact with the adjacent substrate corners 48. Initial engagement between the upper arms 28 and the substrate corners occurs at a location along the arms inwardly of contacts 38.

In this way, contacts 38 are brought into engagement with the substrate with the top of the substrate without engaging the or hanging up on the corners with risk of injuring both the clip and substrate.

Initial contact between the upper lead arms and the substrate positions the substrate within the opening 18. Continued lowering of the substrate into the opening rotates leads 20 downwardly around axis 36 to achieve the fully inserted position of FIG. 5. During this step, the contacts 38 and 40 are brought into contact with the top and bottom of the substrate and are wiped a distance inwardly along the substrate to form wiped pressure contacts with conductive pads. The width of the substrate is greater than the minimum width of mouth 34 so that the arms are forced apart during loading on the substrate. The stressed clip arms act as springs and bias contacts 38 and 40 against the substrate. Following mounting of the leads on the substrate as described the permanent electrical connections may be formed between the clips and contact pads on the substrate in a conventional manner. For instance, the clip contact arms may be provided with a solder coating or may carry a mass of solder such that heating of the clips melts the solder and forms soldered joints joining the clips to the contact pads.

While we have illustrated and described a preferred embodiment of our invention, it is understood that this is capable of modification, and we therefore do not wish to be limited to the precise details set forth, but desire to avail ourselves of such changes and alterations as fall within the purview of the following claims.

What We claim as our invention is:

1. The method of mounting a lead on a substrate, the substrate having top and bottom surfaces and edge corners and the lead having a clip with first and second arms, a first contact on the first arm and a substrate support on the second arm, comprising the steps of:
   a) relatively positioning the clip adjacent an edge of the substrate with the arms facing the edge, the first contact to one side of the substrate edge and the bottom of the substrate resting on the substrate support;
   b) relatively rotating the clip toward the substrate to freely move the first contact over the corner at the top of the substrate without engaging the corner and then above the substrate, while maintaining the substrate on the support; and
   c) further rotating the clip relative to the substrate to move the first contact into engagement with the top surface of the substrate inwardly of the substrate corner.

2. The method of claim 1 including the step of moving the first contact along the top surface of the substrate to form a wiped connection between the contact and the top of the substrate.

3. The method of claim 2 wherein the clip includes a second contact on the second arm, including the step of moving the second contact into engagement with the bottom of the substrate and moving the substrate support out of engagement with the substrate during rotation of the clip relative to the substrate.

4. The method of claim 3 including the step of moving the second contact along the bottom of the substrate.

5. The method of claim 1 including the step of spreading the contact arms apart as the clip is rotated onto the substrate.

6. The method of mounting a substrate having spaced opposed substrate corners onto individual leads, each lead being integrally connected to an essentially flat lead frame unit by a carrier strip to form two like, opposed rows of similarly mounted leads forming the opposite sides of a central opening in the lead frame unit, the leads each having an inwardly facing clip comprising first and second arms with first contacts on the first arms and substrate supports on the second arms, comprising the steps of:
   a) locating the clips to one side of the lead frame unit with the substrate supports in the two rows being located more closely together than the first arms;
   b) placing a substrate on the substrate supports and moving the substrate toward the lead unit while rotating the clips onto the substrate; and
   c) moving the first contacts freely over the corners of the substrate, inwardly of the substrate corners and then into engagement with the top surface of the substrate.

7. The method of claim 6 including forming wiped connections between the first contacts and the top of the substrate.

8. The method of claim 7 wherein the second arms include second contacts, including the steps of moving the substrate supports out of the engagement with the bottom surface of the substrate and moving the second contacts into engagement with the bottom surface of the substrate.

9. The method of claim 6 including the step of spreading the contact arms apart as the clips are rotated onto the substrate.

* * * * *